United States Patent
Ogino

(10) Patent No.: US 12,078,670 B2
(45) Date of Patent: Sep. 3, 2024

(54) METHOD OF DETECTING FAILURE OF ANTIPARALLEL THYRISTOR, AND POWER CONTROL DEVICE

(71) Applicant: Tokyo Electron Limited, Tokyo (JP)

(72) Inventor: Takashi Ogino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/949,363

(22) Filed: Sep. 21, 2022

(65) Prior Publication Data

US 2023/0100212 A1 Mar. 30, 2023

(30) Foreign Application Priority Data

Sep. 28, 2021 (JP) ................................. 2021-158164

(51) Int. Cl.
*G01R 31/26* (2020.01)
*H05B 1/02* (2006.01)

(52) U.S. Cl.
CPC ............. *G01R 31/263* (2013.01); *H05B 1/02* (2013.01)

(58) Field of Classification Search
CPC ............. G01R 31/263; G01R 31/2856; G01R 31/2874; G01R 31/3274; G01R 19/16571; G01R 31/00; G01R 31/3333; G01R 31/2601; G01R 19/1659; H05B 1/02; H05B 1/0233; H05B 3/283; H03K 17/08144; G05F 1/12; H02J 3/12; H02J 3/00

See application file for complete search history.

(56) References Cited

U.S. PATENT DOCUMENTS 10,256,804 B2 * 4/2019 Kim ..................... G01R 31/263
11,159,160 B2 * 10/2021 Shigeta .............. G01R 19/1659
11,165,419 B2 * 11/2021 Nakano .................... H02H 3/05

FOREIGN PATENT DOCUMENTS

JP 2010-122082 A 6/2010
JP 2017-147924 A 8/2017

* cited by examiner

*Primary Examiner* — Vinh P Nguyen
(74) *Attorney, Agent, or Firm* — Nath, Goldberg & Meyer; Jerald L. Meyer; Tanya E. Harkins

(57) ABSTRACT

A method of detecting a failure of an antiparallel thyristor, wherein the antiparallel thyristor includes a first thyristor and a second thyristor connected in parallel and in opposite directions, and is configured to control power supplied from an alternating current power supply to a load, the method including: detecting, as a first detection value, a voltage or a current supplied to the load when ceasing an output command for the second thyristor and issuing an output command for the first thyristor; detecting, as a second detection value, the voltage or the current supplied to the load when ceasing the output command for the first thyristor and issuing the output command for the second thyristor; and determining the failure of the antiparallel thyristor based on a difference between the first detection value and the second detection value.

6 Claims, 4 Drawing Sheets

METHOD OF DETECTING FAILURE OF ANTIPARALLEL THYRISTOR, AND POWER CONTROL DEVICE

CROSS-REFERENCE TO RELATED APPLICATION

This application is based upon and claims the benefit of priority from Japanese Patent Application No. 2021-158164, filed on Sep. 28, 2021, the entire contents of which are incorporated herein by reference.

TECHNICAL FIELD

The present disclosure relates to a method of detecting a failure of an antiparallel thyristor, and a power control device.

BACKGROUND

A substrate processing apparatus is provided with a heater for heating a substrate. An antiparallel thyristor is provided as a component that controls the output of the heater.

Patent Document 1 discloses a detector for detecting a failure of an antiparallel thyristor including a first thyristor and a second thyristor which are connected in antiparallel.

PRIOR ART DOCUMENT

Patent Document

Patent Document 1: Japanese Laid-Open Publication No. 2017-147924

SUMMARY

According to an aspect, there is provided a method of detecting a failure of an antiparallel thyristor, wherein the antiparallel thyristor includes a first thyristor and a second thyristor connected in parallel and in opposite directions, and is configured to control power supplied from an alternating current power supply to a load, the method including: detecting, as a first detection value, a voltage or a current supplied to the load when ceasing an output command for the second thyristor and issuing an output command for the first thyristor; detecting, as a second detection value, the voltage or the current supplied to the load when ceasing the output command for the first thyristor and issuing the output command for the second thyristor; and determining the failure of the antiparallel thyristor based on a difference between the first detection value and the second detection value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
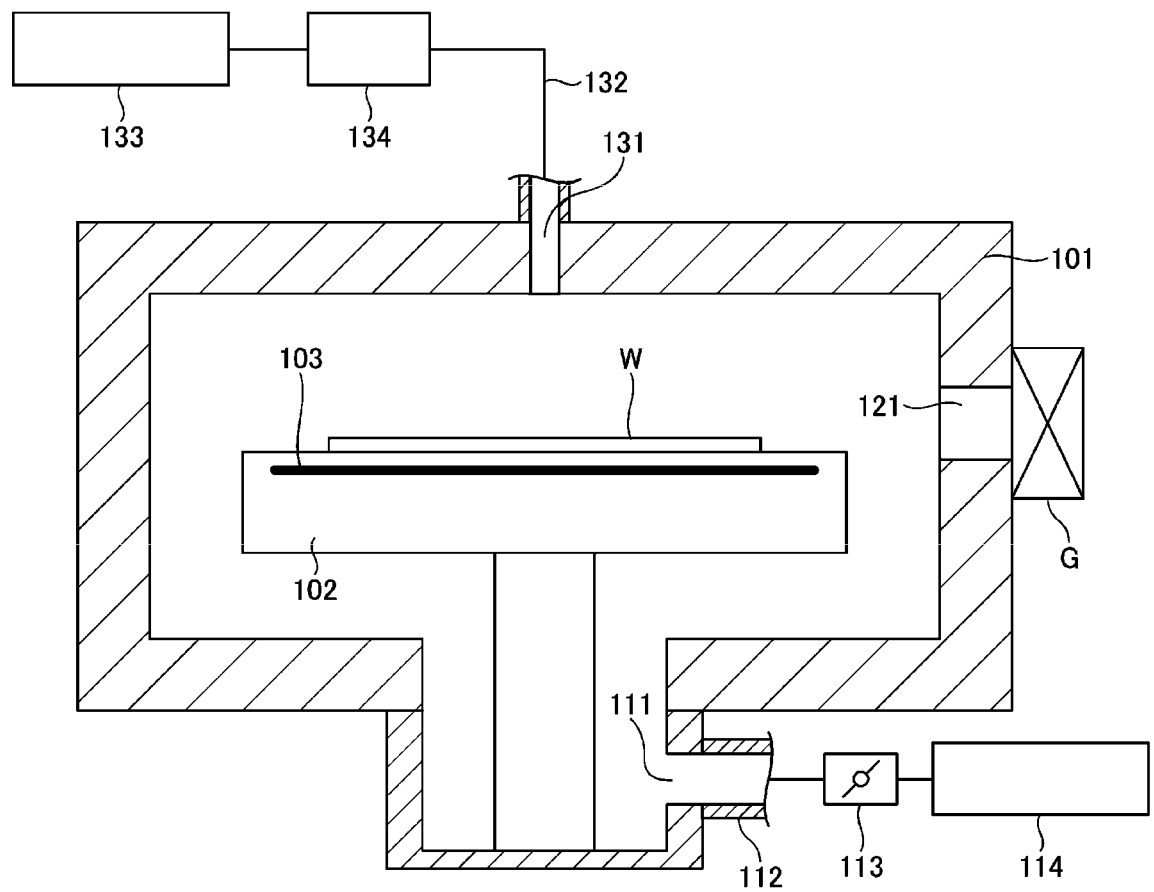
FIG. 1 is an example of a cross-sectional view of a substrate processing apparatus.

Hereinafter, embodiments of the present disclosure will be described with reference to the accompanying drawings. In each of the drawings, the same components may be denoted by the same reference numerals, and redundant descriptions thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

A substrate processing apparatus 100 of the present embodiment will be described with reference to FIG. 1. FIG. 1 is an example of a cross-sectional view of the substrate processing apparatus 100.

The substrate processing apparatus 100 includes a processing container 101 formed in a cylindrical shape and made of, for example, aluminum or the like. A stage 102 on which a substrate W is placed is provided inside the processing container 101. The stage 102 includes, for example, a base made of aluminum, nickel, or the like, and a member made of an electrically insulating material (dielectric material) disposed on the base. The member made of the electrically insulating material is formed of, for example, aluminum nitride (AlN) ceramic. A heater 103 is provided inside the member made of the electrically insulating material. The heater 103 generates heat by being supplied with power from a power supply (see FIG. 2 to be described later), and adjusts a temperature of the stage 102 and the substrate W placed on the stage 102. A plurality of sections may be formed in the member made of the electrically insulating material, and each section may be provided with the heater 103 capable of being independently supplied with power. In this case, a power supply is provided to correspond to the heater 103 in each section. The stage 102 includes three substrate support pins (not illustrated) for substrate transfer, which are provided to move upward and downward with respect to the surface of the stage 102.

An exhaust port 111 is provided at the bottom portion of the processing container 101. An exhaust pipe 112 is connected to the exhaust port 111. A throttle valve 113 that performs a pressure adjustment and a vacuum pump 114 are connected to the exhaust pipe 112, so that the interior of the processing container 101 may be evacuated. A substrate loading/unloading port 121 is formed in a sidewall of the processing container 101. The substrate loading/unloading port 121 is opened/closed by a gate valve G. Further, the substrate W is loaded into and unloaded from the processing container 101 in the state in which the gate valve G is opened.

A gas introduction port 131 is provided in the center of a ceiling wall of the processing container 101. A gas supply pipe 132 is connected to the gas introduction port 131. A gas source 133 for supplying a processing gas used for a process is connected to the gas supply pipe 132. A gas controller 134 including a gas flow rate controller, a valve, and the like is provided in the gas supply pipe 132.

In the substrate processing apparatus 100 configured as above, the gate valve G is opened, the substrate W is placed on the stage 102, the gate valve G is closed, the interior of the processing container 101 is evacuated by the vacuum pump 114 so that the interior of the processing container 101 is adjusted to a predetermined pressure by the throttle valve 113, and the temperature of the substrate W on the stage 102 is adjusted to a predetermined temperature by the heater 103. Then, the processing gas is supplied from the gas source 133 into the processing container 101 via the gas supply pipe 132 and the gas introduction port 131 so that the substrate W is subjected to a desired process.

The configuration of the substrate processing apparatus 100 is not limited to the configuration illustrated in FIG. 1. The substrate processing apparatus 100 may be a plasma processing apparatus that generates plasma inside the processing container 101 to process the substrate W.

Figure 2:
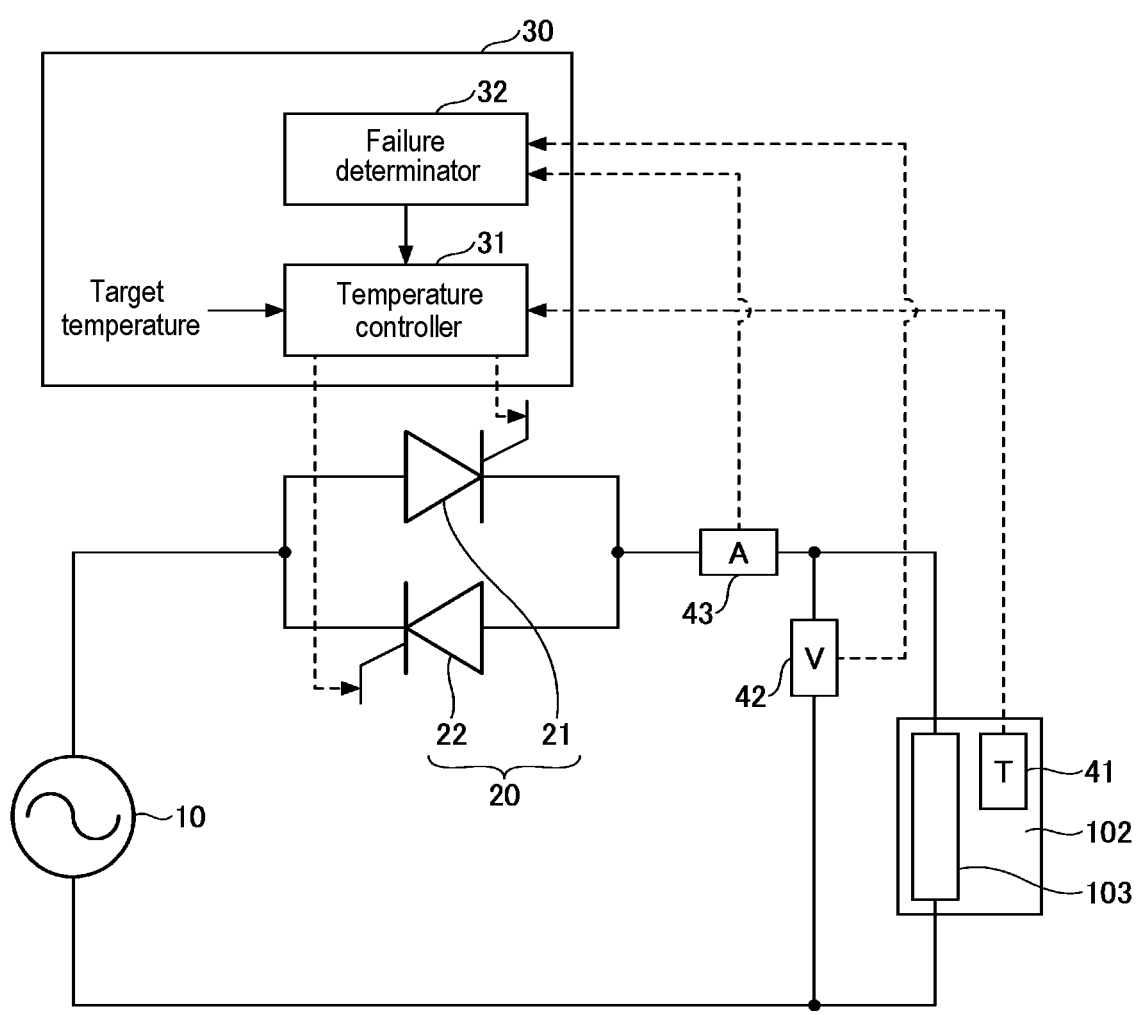
FIG. 2 is an example of a view illustrating a configuration of a power supply that supplies electric power to a heater.

Next, a power supply that supplies power to the heater 103 will be described with reference to FIG. 2. FIG. 2 is an example of a view illustrating a configuration of the power supply that supplies the power to the heater 103.

The power supply includes an AC power supply 10, an antiparallel thyristor 20, and a controller 30. The antiparallel thyristor 20 and the controller 30 constitute a power control device that controls the power to be supplied from the AC power supply 10 to the heater (load) 103.

The AC power supply 10 supplies AC power to the heater 103 via the antiparallel thyristor 20.

The antiparallel thyristor 20 includes a first thyristor 21 and a second thyristor 22 which are connected in parallel and in a direction opposite each other. The first thyristor 21 is turned ON in response to an output command from the temperature controller 31 of the controller 30 to output a positive voltage from the AC power supply 10 to the heater 103. When the AC voltage from the AC power supply 10 becomes a negative voltage, the first thyristor 21 is turned OFF. The second thyristor 22 is turned ON in response to an output command from the temperature controller 31 of the controller 30 to output a negative voltage from the AC power supply 10 to the heater 103. When the AC voltage from the AC power supply 10 becomes a positive voltage, the second thyristor 22 is turned OFF.

The stage 102 is provided with a temperature detector 41 that detects a temperature of the stage 102. In addition, the power supply is provided with a voltage detector 42 that detects the AC voltage supplied to the heater 103. In addition, the power supply is provided with a current detector 43 that detects an AC current supplied to the heater 103.

The controller 30 includes the temperature controller 31 and a failure determinator 32.

The temperature controller 31 controls the first thyristor 21 and the second thyristor 22 by controlling the timing of the output commands. As a result, the temperature controller 31 controls the power to be supplied to the heater 103 to control the temperature of the heater 103. A target temperature of the stage 102 is input to the temperature controller 31. In addition, a detection temperature of the stage 102 detected by the temperature detector 41 is input to the temperature controller 31. Based on the target temperature and the detection temperature detected by the temperature detector 41, the temperature controller 31 controls the first thyristor 21 and the second thyristor 22 such that the detection temperature approaches the target temperature.

The failure determinator 32 determines the presence or absence of failure of the antiparallel thyristor 20 (the first thyristor 21 and the second thyristor 22). Data about the supply voltage to the heater 103, which is detected by the voltage detector 42, is input to the failure determinator 32. Data about the supply current to the heater 103, which is detected by the current detector 43, is input to the failure determinator 32.

Here, a failure mode of the antiparallel thyristor 20 is classified into the following three modes.

A first failure mode refers to a case in which a short (ON) failure occurs in one of the first thyristor 21 and the second thyristor 22.

A second failure mode refers to a case in which an open (OFF) failure occurs in one of the first thyristor 21 and the second thyristor 22.

A third failure mode refers to a case in which failure occurs in both the first thyristor 21 and the second thyristor 22. That is, the third failure mode refers to the case in which the open (OFF) failure occurs in both the first thyristor 21 and the second thyristor 22, the case in which the short (ON) failure occurs in both the first thyristor 21 and the second thyristor 22, and the case in which the open (OFF) failure occurs in one of the first thyristor 21 and the second thyristor 22 and the short (ON) failure occurs in the other of the first thyristor 21 and the second thyristor 22.

Figure 3:
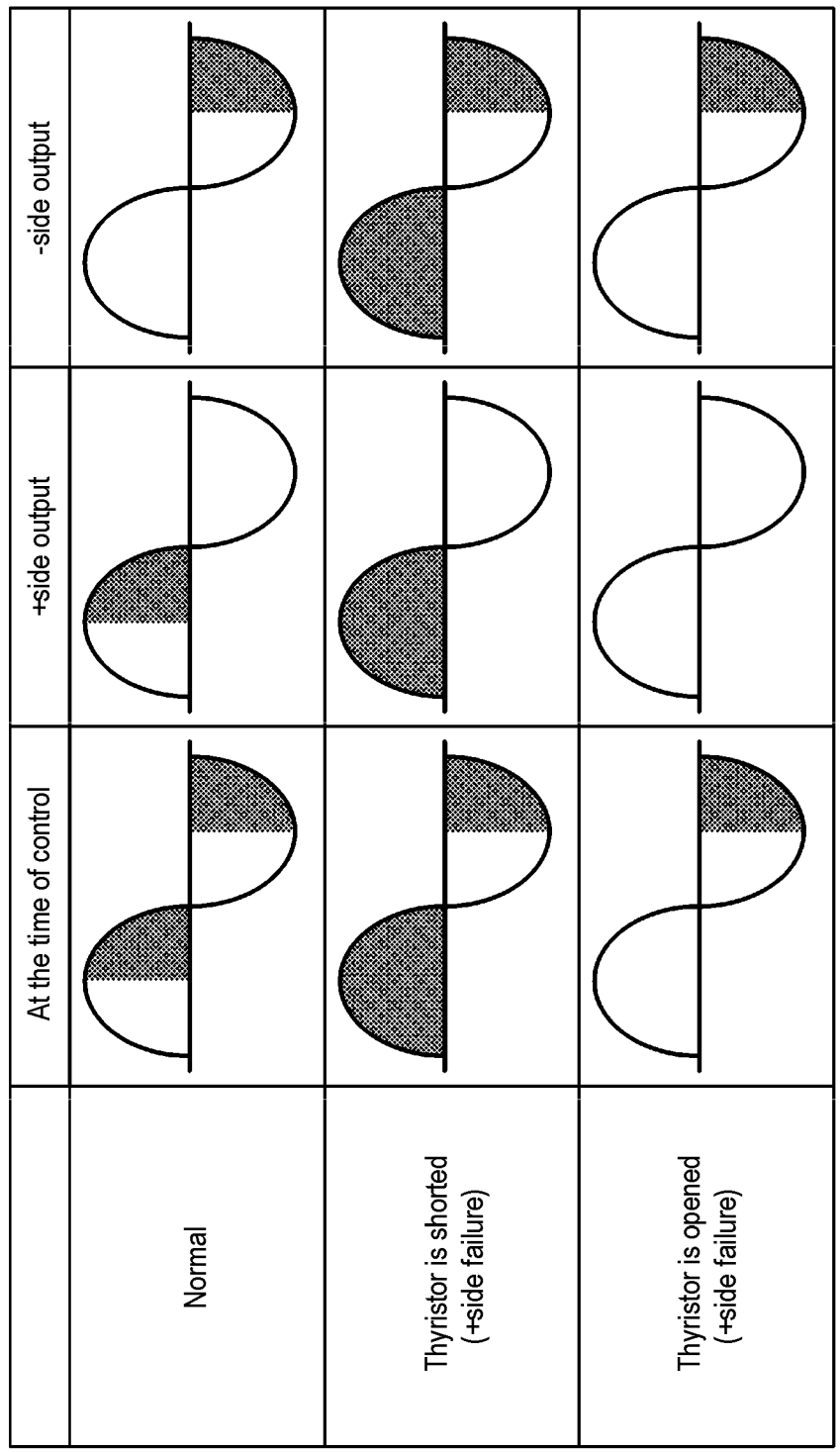
FIG. 3 is an example of electric power to be supplied to a heater based on a failure state of an antiparallel thyristor.

FIG. 3 shows an example of electric power supplied to the heater 103 based on the failure state of the antiparallel thyristor 20. In each graph, the horizontal axis represents time and the vertical axis represents voltage. In addition, AC waveforms of the AC power supply 10 are illustrated by solid lines. In addition, the voltage supplied to the heater 103 when the first thyristor 21 and the second thyristor 22 are turned ON is illustrated with shading (hatched with dots). The voltage detected by the voltage detector 42 corresponds to the area of shading (hatched with dots).

In FIG. 3, the upper stage shows a normal (no failure) state of the antiparallel thyristor 20. The middle stage shows a case in which the short (ON) failure occurs in the first thyristor 21 on the positive side. The lower stage shows a case in which the open (OFF) failure occurs in the first thyristor 21 on the positive side.

In addition, "at the time of control" in the left column indicates a case in which the first thyristor 21 and the second thyristor 22 are controlled. The "+side output" in the center column indicates a case in which the first thyristor 21 on the positive side is controlled and the second thyristor 22 on the negative side is controlled in an OFF state. The "−side output" in the right column indicates a case in which the second thyristor 22 on the negative side is controlled and the first thyristor 21 on the positive side is controlled in an OFF state.

Here, in the normal state, the temperature controller 31 may control the power to be supplied to the heater 103 by controlling the timing of the output commands of the first thyristor 21 and the second thyristor 22 as illustrated in the graph on the left side of the upper stage, thereby controlling the temperature of the heater 103.

When the short failure occurs in one thyristor (the first thyristor 21), the temperature controller 31 may increase or decrease the power to be supplied to the heater 103 by controlling the timing of the output command of the second thyristor 22 as illustrated in the graph on the left side of the middle stage, thereby controlling the temperature of the heater 103.

In addition, when the open failure occurs in one thyristor (the first thyristor 21), the temperature controller 31 may increase or decrease the power to be supplied to the heater 103 by controlling the timing of the output command of the second thyristor 22 as illustrated in the graph on the left side of the lower stage, thereby controlling the temperature of the heater 103.

In this way, even when failure occurs in one of the first thyristor 21 and the second thyristor 22, the temperature of the heater 103 may be controlled. When the heater 103 is continuously used in the state in which failure occurs in one of the first thyristor 21 and the second thyristor 22, the heater 103 may be damaged. Therefore, there is required a failure detection method of detecting the failure of the antiparallel thyristor 20 even when failure occurs in one of the first thyristor 21 and the second thyristor 22.

<Failure Detection Method>

Figure 4:
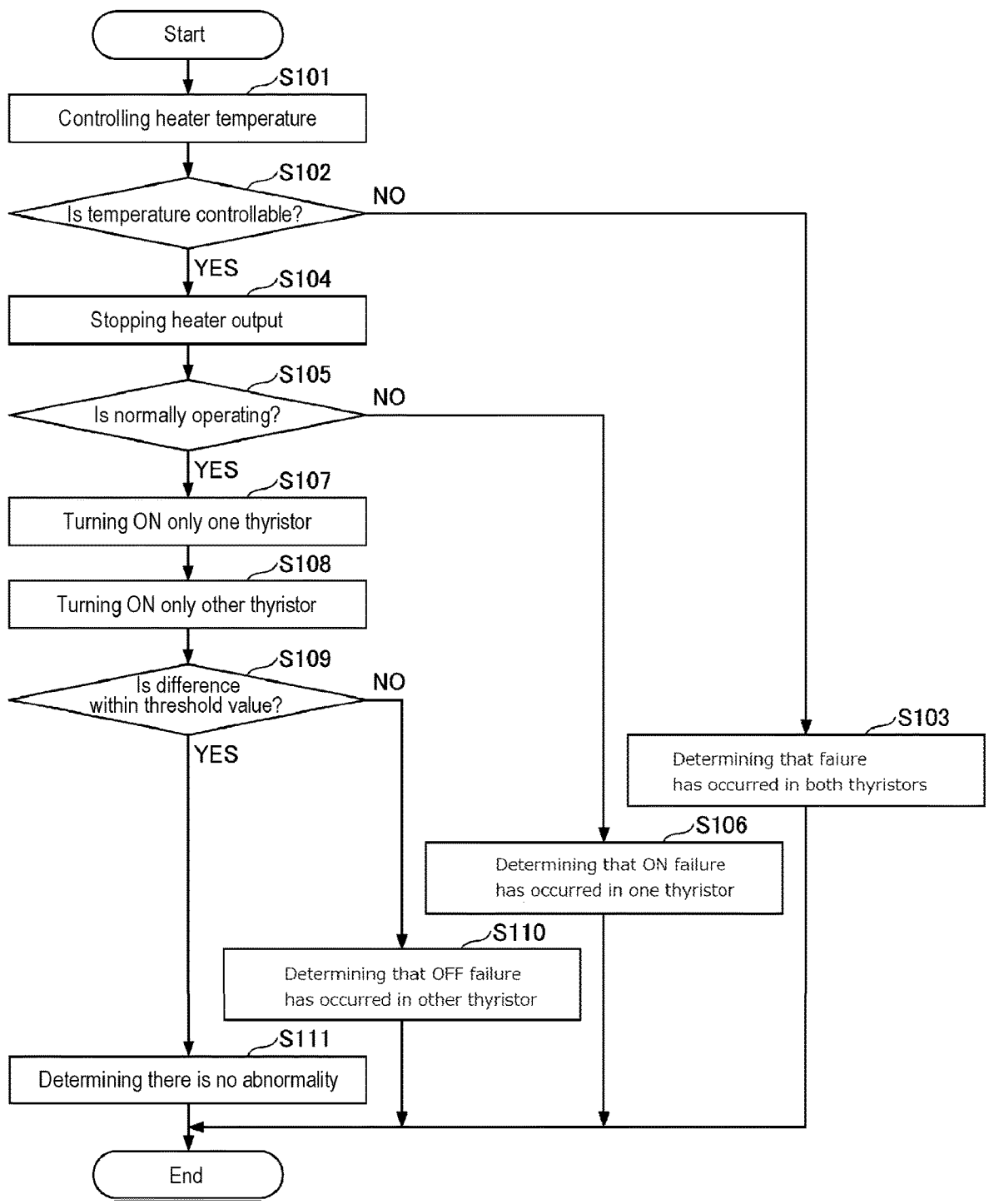
FIG. 4 is an example of a flowchart illustrating a method of detecting a failure of the antiparallel thyristor.

The method of detecting a failure of the antiparallel thyristor 20 will be described with reference to FIG. 4. FIG. 4 is an example of a flowchart illustrating the method of detecting a failure of the antiparallel thyristor 20. The process illustrated below is executed at a timing different from the timing at which the substrate processing apparatus 100 performs a process on the substrate W (e.g., during an idle state of the substrate processing apparatus 100, during a temperature raising process of the stage 102, or the like).

In step S101, the temperature controller 31 of the controller 30 controls the temperature of the heater 103. The temperature controller 31 controls the power to be supplied to the heater 103 by controlling the timing of the output commands of the first thyristor 21 and the second thyristor 22, thereby controlling the temperature of the heater 103.

In step S102, the failure determinator 32 of the controller 30 determines whether or not the temperature of the heater 103 is controllable. When it is determined that the temperature of the heater 103 is not controllable (NO in S102), the process of the controller 30 proceeds to step S103. On the other hand, when it is determined that the temperature of the heater 103 is controllable (YES in S102), the process of the controller 30 proceeds to step S104.

In step S103, the failure determinator 32 of the controller 30 determines that failure has occurred in both the first thyristor 21 and the second thyristor 22 (in a third failure mode). Then, the failure detection process by the controller 30 ends.

In step S104, the temperature controller 31 of the controller 30 stops the output of the heater 103. That is, the temperature controller 31 ceases an output command to the first thyristor 21 and the second thyristor 22 for a predetermined period of time. The failure determinator 32 of the controller 30 stores a voltage (third detection value) detected by the voltage detector 42 and a current (third detection value) detected by the current detector 43 in that state.

In a configuration in which the voltage detector 42 and the current detector 43 include the capacitors, the stop time is determined in consideration of discharge times of the capacitors.

In step S105, the failure determinator 32 of the controller 30 determines whether or not the first thyristor 21 and the second thyristor 22 are operating normally. In this case, when the short (ON) failure occurs in one of the first thyristor 21 and the second thyristor 22, the voltage (third detection value) detected by the voltage detector 42 and the current (third detected value) detected by the current detector 43 are not near zero. Therefore, when the voltage (third detection value) detected by the voltage detector 42 is less than a predetermined threshold value (second threshold value), the failure determinator 32 determines that the first thyristor 21 and the second thyristor 22 are operating normally. On the other hand, when the voltage (third detection value) detected by the voltage detector 42 is equal to or higher than the predetermined threshold value (second threshold value), the failure determinator 32 determines that the first thyristor 21 and the second thyristor 22 are operating abnormally. The determination may be made based on the current detected by the current detector 43 instead of the voltage detected by the voltage detector 42. When it is determined that the first thyristor 21 and the second thyristor 22 are operating abnormally (NO in S105), the process of the controller 30 proceeds to step S106. When it is determined that the first thyristor 21 and the second thyristor 22 are operating normally (YES in S105), the process of the controller 30 proceeds to step S107.

In step S106, the failure determinator 32 of the controller 30 determines that the short failure (first failure mode) has occurred in one of the first thyristor 21 and the second thyristor 22. Then, the failure detection process by the controller 30 ends.

In step S107, the temperature controller 31 of the controller 30 issues an output command such that only the first thyristor 21 is turned ON and ceases an output command such that the second thyristor 22 is turned OFF. The failure determinator 32 of the controller 30 stores the voltage (first detection value) detected by the voltage detector 42 and the current (first detection value) detected by the current detector 43 in that state.

In step S108, the temperature controller 31 of the controller 30 issues an output command such that only the second thyristor 22 is turned ON and ceases an output command such that the first thyristor 21 is turned OFF. The failure determinator 32 of the controller 30 stores the voltage (first detection value) detected by the voltage detector 42 and the current (first detection value) detected by the current detector 43 in that state.

In step S109, the failure determinator 32 of the controller 30 determines whether or not a difference between the voltage (first detection value) detected in step S106 and the voltage (first detection value) detected in step S107 is equal to or less than a threshold value. Alternatively, the failure determinator 32 of the controller 30 determines whether or not the difference between the current (first detection value) detected in step S106 and the current (first detection value) detected in step S107 is equal to or less than the threshold value. When it is determined that the difference is not equal to or less than the threshold value (first threshold value) (NO in S109), the process of the controller 30 proceeds to step S110. On the other hand, when it is determined that the difference is equal to or less than the threshold value (first threshold value) (S109, "YES"), the process of the controller 30 proceeds to step S111.

In step S110, the failure determinator 32 of the controller 30 determines that the open failure has occurred in one of the first thyristor 21 and the second thyristor 22 has an (second failure mode). Then, the failure detection process of the controller 30 ends.

In step S111, the failure determinator 32 of the controller 30 determines that no abnormality (no failure) has occurred in the first thyristor 21 and the second thyristor 22. Then, the failure detection process of the controller 30 ends.

As described above, with the method of detecting a failure of the antiparallel thyristor 20 according to the present embodiment, even if the failure occurs in either the first thyristor 21 or the second thyristor 22, the failure of the respective thyristor can be detected. This makes it possible to prevent the heater 103 from being damaged.

For example, when no failure occurs in the first thyristor 21 and the second thyristor 22, the voltage detected in step S107 corresponds to the area of the shaded portion in the graph in the center column of the upper stage in FIG. 3. In addition, the voltage detected in step S108 corresponds to the area of the shaded portion of the graph in the right column of the upper stage in FIG. 3. Therefore, the difference between the first detection value in step S107 and the second detection value in step S108 is close to zero.

When the open failure has occurred in the first thyristor 21, the voltage detected in step S107 becomes zero as shown in the graph in the center column of the lower stage in FIG. 3. The voltage detected in step S108 corresponds to the area of the shaded portion in the graph in the right column of the lower stage in FIG. 3. Therefore, the difference between the first detection value in step S107 and the second detection value in step S108 becomes larger. Therefore, the failure determinator 32 of the controller 30 may determine the failure of the antiparallel thyristor 20 based on these differences.

On the other hand, when the short failure has occurred in the first thyristor 21, the voltage detected in the process of step S107 corresponds to the area of the shaded portion of the graph in the center column of the middle stage in FIG. 3. In addition, the voltage detected in step S108 corresponds to the area of the shaded portion of the graph in the right column of the middle stage in FIG. 3. Therefore, the difference between the first detection value in step S107 and the second detection value in step S108 becomes larger. Thus, the short failure of the first thyristor 21 may also be determined by the processes illustrated in steps S107 to S109.

In a multi-heater in which a plurality of sections are formed in a member made of an electrically insulating material and each section is provided with a heater 103 capable of being independently supplied with power, when a failure occurs in an antiparallel thyristor 20 corresponding to any of the heaters, a temperature difference may occur in the member made of the electrically insulating material, and the member made of the electrically insulating material or the heater 103 may be damaged. With the method of detecting a failure of the antiparallel thyristor 20 according to the present embodiment, it is possible to detect the failure of either one of the first thyristor 21 and the second thyristor 22. This makes it possible to prevent the member made of the electrically insulating material or the heater 103 from being damaged.

In step S104, when one of the voltage (third detection value) detected by the voltage detector 42 and the current (third detection value) detected by the current detector 43 is less than the threshold value (second threshold value) and the other is equal to or greater than the threshold value (second threshold value), an offset may be determined to have occurred in the detection value of the voltage detector 42 or the current detector 43.

According to an aspect, it is possible to provide a method of detecting a failure of a thyristor, for example, an antiparallel thyristor, and a power control device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of detecting a failure of an antiparallel thyristor, wherein the antiparallel thyristor includes a first thyristor and a second thyristor connected in parallel and in opposite directions, and is configured to control power supplied from an alternating current power supply to a load, the method comprising:
   detecting, as a third detection value, the voltage or the current supplied to the load when ceasing the output commands for the first thyristor and the second thyristor to determine whether a short failure occurs in one of the first thyristor and the second thyristor; and
   in response to the determination that the short failure has not occurred in at least one selected from the group of the first thyristor and the second thyristor, performing a process including:
      detecting, as a first detection value, a voltage or a current supplied to the load when ceasing an output command for the second thyristor and issuing an output command for the first thyristor;
      detecting, as a second detection value, the voltage or the current supplied to the load when ceasing the output command for the first thyristor and issuing the output command for the second thyristor; and
      determining the failure of the antiparallel thyristor based on the third detection value and based on a difference between the first detection value and the second detection value.

2. The method of claim 1, wherein the determining the failure of the antiparallel thyristor based on the difference between the first detection value and the second detection value includes determining that, when the difference between the first detection value and the second detection value is equal to or greater than a predetermined first threshold value, the failure has occurred in the antiparallel thyristor.

3. The method of claim 1, wherein the load is a heater provided inside a member made of an electrically insulating material.

4. The method of claim 2, wherein the determining the failure of the antiparallel thyristor based on the third detection value includes determining that, when the third detection value is equal to or greater than a predetermined second threshold value, the failure has occurred in the antiparallel thyristor.

5. The method of claim 4, wherein the load is a heater provided inside a member made of an electrically insulating material.

6. A power control device comprising:
   an antiparallel thyristor which includes a first thyristor and a second thyristor connected in parallel and in opposite directions, and is configured to control power supplied from an alternating current power supply to a load; and
   a controller configured to control the antiparallel thyristor, wherein the controller is configured to execute:
   detecting, as a third detection value, the voltage or the current supplied to the load when ceasing the output commands for the first thyristor and the second thyristor to determine whether a short failure occurs in one of the first thyristor and the second thyristor; and
   in response to the determination that the short failure has not occurred in at least one selected from the group of the first thyristor and the second thyristor, the controller is further configured to execute:
      detecting, as a first detection value, a voltage or a current supplied to the load when ceasing an output command for the second thyristor and issuing an output command for the first thyristor;
      detecting, as a second detection value, the voltage or the current supplied to the load when ceasing the output command for the first thyristor and issuing the
output command for the second thyristor; and determining the failure of the antiparallel thyristor
based on the third detection value and based on a
difference between the first detection value and the
second detection value.

\* \* \* \* \*